US008416106B2

(12) United States Patent
Thachile

(10) Patent No.: US 8,416,106 B2
(45) Date of Patent: Apr. 9, 2013

(54) CALIBRATION SCHEME FOR RESOLUTION SCALING, POWER SCALING, VARIABLE INPUT SWING AND COMPARATOR OFFSET CANCELLATION FOR FLASH ADCS

(75) Inventor: Pradip Thachile, Los Gatos, CA (US)

(73) Assignee: Fujitsu Limited, Kawasaki-shi (JP)

( * ) Notice: Subject to any disclaimer, the term of this patent is extended or adjusted under 35 U.S.C. 154(b) by 121 days.

(21) Appl. No.: 13/090,501

(22) Filed: Apr. 20, 2011

(65) Prior Publication Data

US 2012/0268301 A1 Oct. 25, 2012

(51) Int. Cl.
*H03M 1/10* (2006.01)

(52) U.S. Cl.
USPC .......... 341/120; 326/30; 327/74; 327/94; 327/333; 327/565; 455/326; 455/333; 330/9; 330/51; 330/99; 330/253; 330/258

(58) Field of Classification Search .......... 341/120–156; 326/30; 327/74, 94, 333, 565; 455/326; 455/333; 330/9, 51, 99, 253, 258

See application file for complete search history.

(56) References Cited

U.S. PATENT DOCUMENTS

| 5,861,829 | A | * | 1/1999 | Sutardja | 341/122 |
| 6,107,949 | A | * | 8/2000 | Gross, Jr. | 341/159 |
| 6,346,905 | B1 | * | 2/2002 | Ottini et al. | 341/159 |
| 6,727,839 | B2 | * | 4/2004 | Mulder et al. | 341/165 |
| 6,762,708 | B1 | * | 7/2004 | Sutardja | 341/155 |
| 6,876,318 | B2 | * | 4/2005 | Mulder et al. | 341/118 |
| 7,129,865 | B2 | * | 10/2006 | Mulder et al. | 341/118 |
| 7,230,561 | B2 | * | 6/2007 | Lee | 341/172 |
| 7,554,477 | B2 | * | 6/2009 | Hung et al. | 341/159 |
| 7,760,126 | B2 | * | 7/2010 | Terranova | 341/159 |
| 7,839,317 | B1 | * | 11/2010 | Sauer | 341/158 |
| 8,111,178 | B2 | * | 2/2012 | Liao et al. | 341/120 |

OTHER PUBLICATIONS

Johns, David. et al., "Analog Integrated Circuit Design," John Wiley & Sons, Inc., New York, Chapters 6, 8, 11 and 13, 1997.
Maloberti, K., "Data Converters," Springer Publishing, Dordrecht, The Netherlands, Chapters 1, 2, 4, 5, and 8, 2010.
Razavi, B., "Design of Analog CMOS Integrated Circuits," McGraw-Hill, Boston, MA, 2001.
Van Der Plas, G. et al., "A 0.16pJ/Conversion-Step 2.5mW 1.25GS/s 4b ADC in a 90nm Digital CMOS Process," *International Symposium on Solid State Circuits*, Session 31.1, 2006.
McCarroll, B. J. et al., "A High-Speed CMOS Comparator for Use in an ADC," *IEEE Journal of Solid State Circuits*, 23:1 pp. 159-165, Feb. 1988.
Park, S. et al., "A 3.5 GS/s 5-b Flash ADC in 90 nm CMOS," *IEEE Custom Integrated Circuits Conference*, 2006.

\* cited by examiner

*Primary Examiner* — Lam T Mai
(74) *Attorney, Agent, or Firm* — Baker Botts L.L.P.

(57) ABSTRACT

In one embodiment, a comparator of a Flash analog-to-digital converter (ADC) is calibrated in the background by switching the comparator to a feedback loop, determining the comparator's current reference level, and adjusting the comparator's reference level to a target reference level by charging a reference capacitor coupled the comparator.

16 Claims, 5 Drawing Sheets

CALIBRATION SCHEME FOR RESOLUTION SCALING, POWER SCALING, VARIABLE INPUT SWING AND COMPARATOR OFFSET CANCELLATION FOR FLASH ADCS

BACKGROUND

An analog-to-digital converter (ADC) converts a continuous quantity (e.g., voltage) into a digital representation (e.g., binary code that represents the voltage). Theoretically, an ideal ADC has a one-to-one mapping, also known as its transfer function. For example, an ideal ADC converts a unique voltage value into a unique digital code. Non-idealities can arise from environmental changes, such as changes in power supply voltage or operating temperature, or operational changes, such as changes in input signal voltages or converter resolution.

DESCRIPTION OF EXAMPLE EMBODIMENTS

Figure 1:
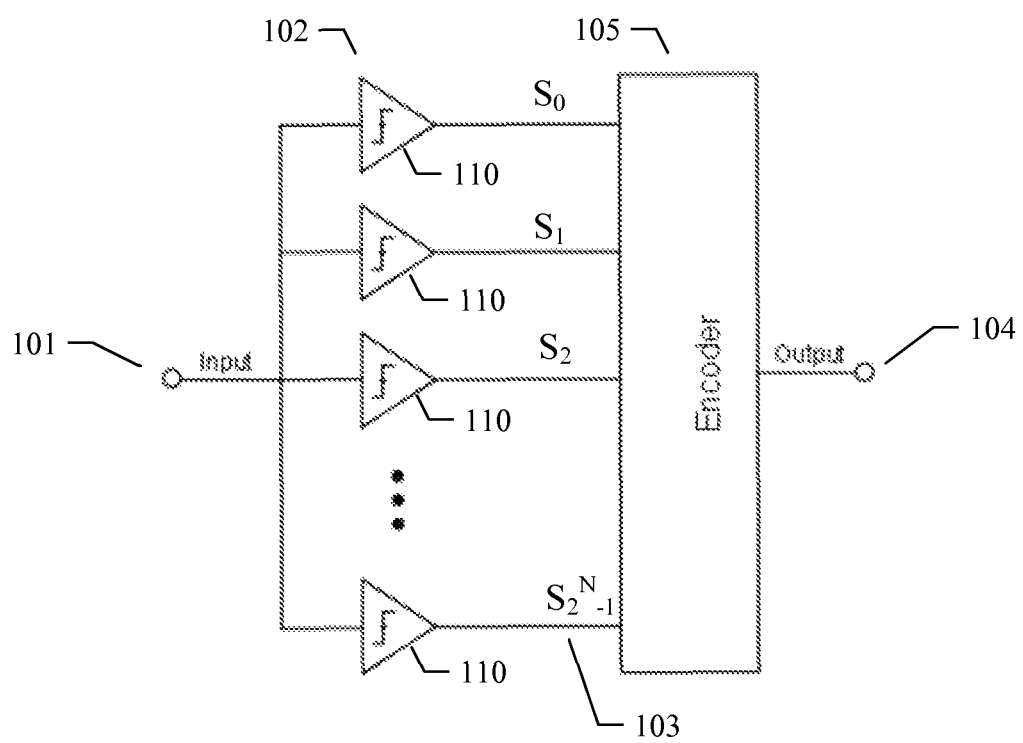
FIG. 1 illustrates an example Flash ADC.

A Flash ADC is a specific type of ADC that utilizes an array of comparators, and quantizes input signals by comparing an analog input signal against a reference at a single instant, defined by a clock signal. FIG. 1 illustrates an example Flash ADC. At every change of a clock signal, a comparator array 102 comprising an array of comparators 110 samples an analog input voltage 101 and converts analog input voltage 101 into a digital output 103 comprising an array of binary digits. For example, if there are $2^N$ comparators 110 in comparator array 102 (e.g., for a Flash ADC having a resolution of N bits), there are $2^N$ binary digits in digital output 103. Each particular comparator (110) of comparator array 102 can sample and compare input voltage 101 to a specific reference level of the particular comparator, and then generate a logic "1" if input voltage 101 is higher than the reference level, or a logic "0" if input voltage 101 is lower than the reference level. For a Flash ADC of a resolution N as illustrated in FIG. 1, the width of digital output 103, which may be the number of bits used to represent input voltage 101, in the Flash ADC is $2^N$. Optionally, digital output 103 of width N can be converted to a binary code of length N (104) by an encoder 105.

Performance of a Flash ADC can degrade due to variations in input voltage swing, and/or variations in reference level or input offset of one or more comparators of the comparator array (e.g., due to changes in power supply voltage or operating temperature). Ordinarily, calibration of a Flash ADC requires placing the Flash ADC in a non-operating mode, which means that the Flash ADC cannot sample analog input signals while being calibrated. Particular embodiments herein describe methods of calibrating a Flash ADC for offset compensation by calibrating one comparator of the comparator array at a time in the background while the Flash ADC is operating (i.e., while the Flash ADC is sampling analog input signals). Particular embodiments also describe methods of adjusting reference levels for variable input voltage swing, and adjusting reference levels for different resolutions of a Flash ADC. Particular embodiments may enable background calibration of a Flash ADC by incorporating an extra comparator in the Flash ADC. A system incorporating the Flash ADC may determine a queue of one or more comparators of the Flash ADC in need of calibration. For example, the system may identify one or more comparators with decaying reference levels at the Flash ADC's output, and form the queue by placing the faster decaying comparators at the front of the queue. The system may place comparators of equal decaying speed at arbitrary positions. The system may place a comparator at the front of the queue in a calibration mode, and replace it with a recently calibrated comparator.

Figure 2:
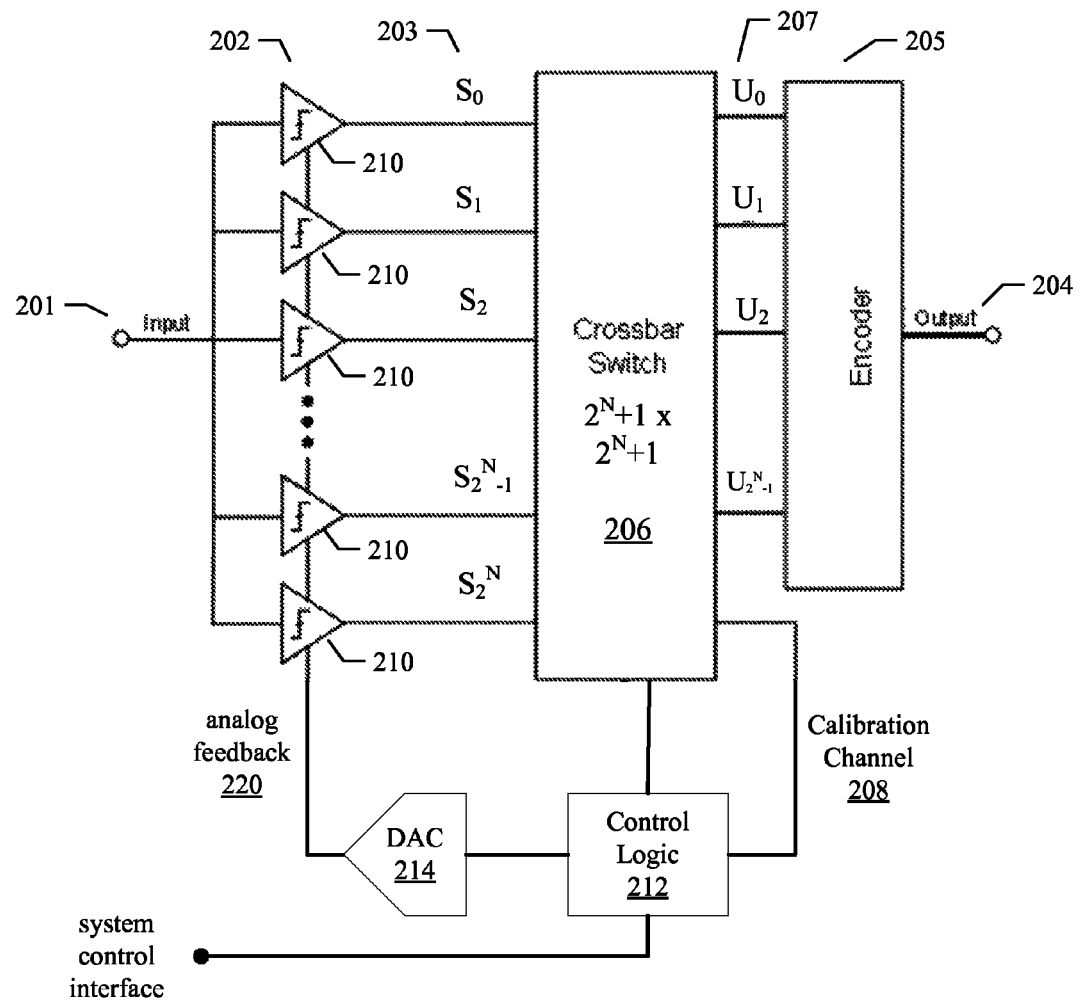
FIG. 2 illustrates an example calibration system for a Flash ADC of a resolution N or N-bit wide.

FIG. 2 illustrates an example calibration system for a Flash ADC of a resolution N or N-bit wide. In particular embodiments, an comparator array 202 comprising an array of N+1 comparator blocks 210 may sample and convert an analog input voltage 201 into a digital output 203 of N+1 bits or signals ($S_0, S_1, S_2, \ldots, S_{2^N-1}$, and $S_{2^N}$) at a single instant defined by a clock signal. For example, at every change of a clock signal, comparator array 202 can sample and convert analog input voltage 201 into digital output 203. Again, since there are $2^N+1$ comparator blocks 210 in comparator array 202, there are $2^N+1$ bits in digital output 203. In particular embodiments, each particular comparator block (210) of comparator array 202 has its own reference level and can compare input voltage 201 to the specific reference level of the particular comparator block, and then generate a logic "1" if input voltage 201 is higher than the reference level, or a logic "0" if input voltage 201 is lower than the reference level. In particular embodiments, crossbar switch 206 may map a particular signal (e.g., $U_{2^N}$) of digital output 203 to a calibration channel 208. In some embodiments, crossbar switch 206 map the rest of N signals 207 (e.g., $U_0, U_1, U_2, \ldots, U_{2^N-1}$) to input of an encoder 205. For example, crossbar switch 206 can identify a comparator block in need of calibration (a "dirty channel"), map a digital output signal of the dirty channel to calibration channel 208; that is, connect an output of the dirty channel's comparator block to calibration channel 208. In some embodiments, encoder 205 may convert the rest of N signals 207 to a binary code of length N (204). In particular embodiments, control logic 212 may be operably coupled to crossbar switch 206, causing crossbar switch 206 to map N bits of digital output 203 to input of encoder 205, and 1 bit of digital output 203 (e.g., a "dirty channel") to calibration channel 208. In particular embodiment, control logic 212 may be operably coupled to calibration channel 208 and generate analog feedback signal 220 to one or more comparator blocks of comparator array 202 via a digital-to-analog converter (DAC) 214.

Figure 3:
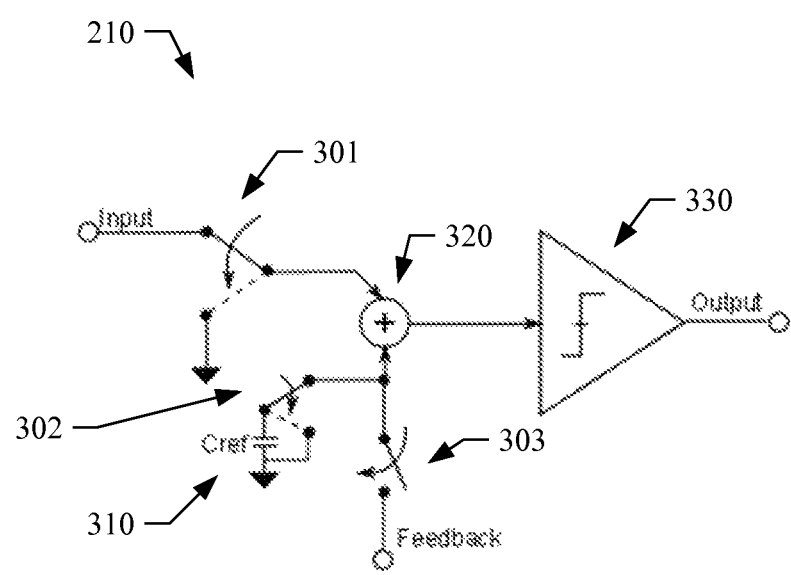
FIG. 3 illustrates an example comparator block for the example Flash ADC of FIG. 2.

FIG. 3 illustrates an example comparator block 210 for the example Flash ADC of FIG. 2. In particular embodiments, comparator block 210 may comprise a first switch 301 configured to switch between an input signal of comparator block 210 and a small signal ground to connect to a first input of an adder 320; a second switch 302 configured to connect a reference capacitor 310 to a second input of adder 320 or discharge reference capacitor 310; a third switch 303 configured to connect or disconnect a feedback signal to the second input of adder 320; a comparator 330 configured to compare an output of adder 320 to a reference level of comparator 330, and then generate a logic "1" if the output of adder 320 is higher than the reference level, or a logic "0" if the output of adder 320 is lower than the reference level. For the example of FIG. 3, if the first switch 301 connects the input of comparator block 210 to the first input of adder 320, the second switch 302 disconnects reference capacitor 310 from adder 320, the third switch 303 disconnect the feedback signal from adder 320, then comparator block 210 is configured to compare the input of comparator block 210 to a reference level of comparator 330, and generate a logic "1" if the input is higher than the reference level, or a logic "0" if the input is lower than the reference level. Additionally, the reference level for converting an analog input of comparator block 210 into a digital signal may be adjusted or calibrated by reference capacitor 310. For example, if the first switch 301 connects the input of comparator block 210 to the first input of adder 320, the second switch 302 connects reference capacitor 310 to the second input of adder 320, and the third switch 303 disconnect the feedback signal from adder 320, then comparator block 210 is configured to compare the input of comparator block 210 to a summation of a reference level of comparator 330 and a reference voltage corresponding to charge held by reference capacitor 310, and generate a logic "1" if the input is higher than the summation, or a logic "0" if the input is lower than the summation. Comparator 330 may have an intrinsic reference level created by capacitor sizing, however, the intrinsic reference level may vary due to complementary-metal-oxide-semiconductor (CMOS) fabrication process. As illustrated in the example of FIG. 3, particular embodiments use reference capacitor 310 to augment the reference level of comparator 330, and the reference level of comparator block 210 for quantizing analog input voltage 201 may be independent of the intrinsic reference level of comparator 330.

Figure 4:
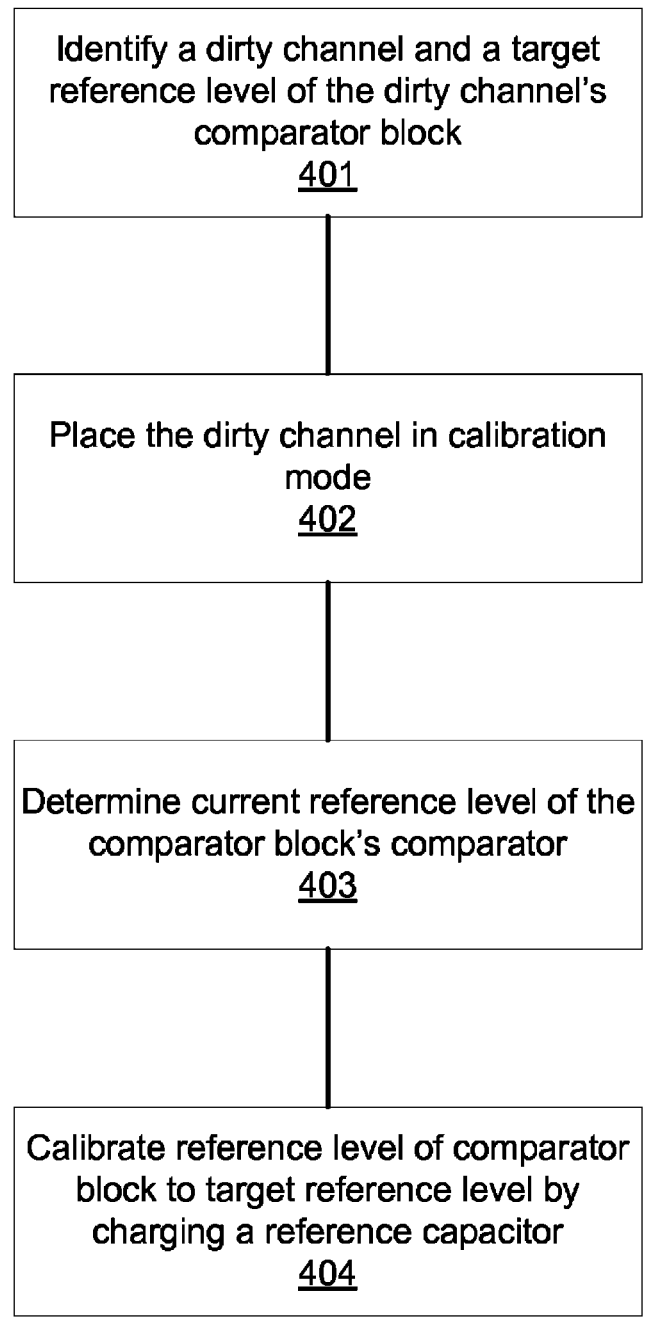
FIG. 4 illustrates an example method of calibrating the example Flash ADC of FIG. 2.

FIG. 4 illustrates an example method of calibrating the example Flash ADC of FIG. 2. In particular embodiments, control logic 212 may identify a dirty channel of comparator array 202 and a target reference level of converting analog input 201 to a digital signal for the dirty channel's comparator block 202 (401). For example, a dirty channel can be the first candidate of the queue of comparators described above. For example, a target reference level for the dirty channel's comparator block 202 can be a desired reference level for the second candidate of the queue of comparators (i.e., after the first candidate is calibrated, the second candidate can be swapped out for calibration with the first candidate taking place of the second candidate in converting an analog input single to a digital signal). In particular embodiments, control logic 212 may place the dirty channel in calibration mode (402). In particular embodiments, control logic 212 may place the dirty channel in calibration mode by placing the dirty channel's comparator block 210 in a feedback loop comprising the comparator block, control logic 212, and DAC 214. In particular embodiment, control logic 212 may cause crossbar switch 206 to map output of the dirty channel to calibration channel 208. In particular embodiments, control logic 212 may connect input of comparator 330 of the dirty channel's comparator block 210 to feedback signal 220. For example, control logic 212 can set the dirty channel's comparator block 210 to switch the first switch 301 to connect to small signal ground, switch the second switch 302 to disconnect reference capacitor 310 from the second input of adder 320 and discharge reference capacitor 310, and switch the third switch 310 to connect the second input of adder 320 to feedback signal 220.

Figure 5:
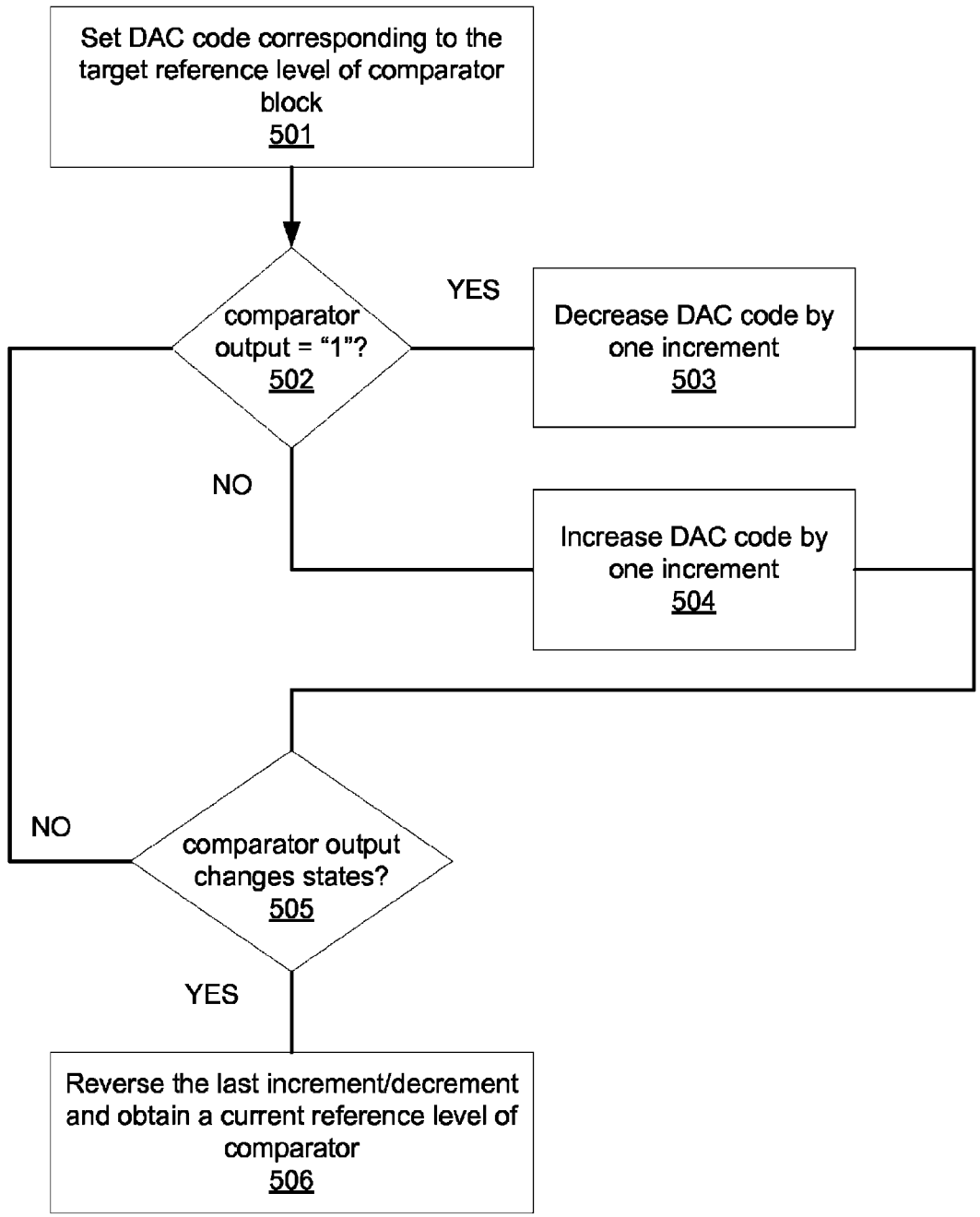
FIG. 5 illustrates an example method of determining a current reference level of a comparator.

In particular embodiments, control logic 212 may determine a current reference level of comparator 330 of the dirty channel's comparator block 210 (403). In particular embodiments, control logic 212 may determine a DAC code (i.e., input digital code of DAC 214) corresponding to a current reference level of comparator 330 by incrementally sweeping through DAC codes, as illustrated in FIG. 5. In the example of FIG. 5, control logic 212 can set a DAC code corresponding to the target reference level of comparator block 210 (501), and examine output of comparator 330 at calibration channel 208 to determine whether the output of comparator 330 is a logic "1" (502). If the output is a logic "1", then control logic 212 can decrease the DAC code by one DAC code increment (503), for example, decrease the DAC code from "000111" to "000011". If the output is logic "0", then control logic 212 can increase the DAC code by one DAC code increment (504), for example, increase the DAC code from "000111" to "001111". After decrementing the DAC code (503) or incrementing the DAC code (504), control logic 212 can examine the output of comparator 330 to determine whether the output changes states (e.g., from logic "1" to "0", or from logic "0" to "1") (505). If the output does not change states from the last increment or decrement, then control logic 212 can continue to increment or decrement the DAC code by going back to step 502. If the output changes states from the last increment or decrement, then control logic 212 can reverse the last increment or decrement, and the resulting DAC code corresponds to a current reference level of comparator 330.

In particular embodiments, control logic 212 may calibrate the reference level of the dirty channel's comparator block 210 to the target reference level by charging reference capacitor 310 (404). In particular embodiments, control logic 212 may determine a DAC code for reference capacitor 310 by subtracting the DAC code corresponding to the target reference level of comparator block 210 by the DAC code corresponding to the current reference level of comparator 330 (e.g., as obtained by the example method of FIG. 5). In particular embodiments, control logic 212 may set the DAC code for reference capacitor 310 for DAC 214. In particular embodiments, control logic 212 may switch the second switch 302 to connect reference capacitor 310 to feedback signal 220 to charge reference capacitor 310. In particular embodiments, control logic 212 may switch the third switch 303 to disconnect the second input of adder 320 from feedback signal 220, after reference capacitor 310 is fully charged. In particular embodiments, control logic 212 may switch the first switch 301 to connect the first input of adder 320 to the input of comparator block 210. As illustrated in the example method of FIG. 4, particular embodiments may calibrate the reference level of a first comparator block to any of the $2^N$ reference levels for quantizing analog input voltage 201, regardless of the intrinsic reference level of the first comparator block's comparator 330.

In particular embodiments, reference level voltage for each reference capacitor 310 may be bounded by full output swing of DAC 214:

$$V_{OS} = \frac{V_{FS\_DAC}}{2^Y}$$

wherein VOS is output swing of DAC 214, VFS DAC is full swing voltage of DAC 214, and Y is the resolution, in bits, of DAC 214. In some embodiments, DAC 214 may operate at a frequency lower than comparator array 202, and may require less silicon area as compared to comparator array 202.

The example system of FIG. 2 may require periodic refresh of reference capacitors 310 of one or more comparator blocks 210 due to gradual discharge of the capacitors. A decay in voltage held by a reference capacitor 310 (due to gradual discharge) of greater than one fourth of a voltage corresponding to the least significant bit of a Flash ADC may cause the Flash ADC to lose one half bit in resolution. A selection of size of reference capacitors 310 may mitigate a risk of excessive refresh or re-calibration of the example Flash ADC in FIG. 2. For example, a RC constant of a product of a size of reference capacitor 310 (e.g., $C_{ref}$) and a total parasitic resistance (e.g. $R_{par}$) seen at reference capacitor 310 (i.e., the refresh period of reference capacitor 310) has to be greater than summation of the time needed to swap a dirty channel (e.g., $t_{swap}$) and a recently calibrated channel and the time needed to calibrate a comparator block 210 (e.g., $t_{cal}$):

$$C_{ref} \times R_{par} \geq t_{swap} + t_{cal}$$

Since tswap and tcal can be integer multiples of a system clock, the refresh period of reference capacitor 310 (i.e., $C_{ref} \times R_{par}$) may be at least an integer multiple of the system clock (e.g., $T_{clk}$:

$$C_{ref} \times R_{par} \geq \alpha \times T_{clk}$$

wherein $\alpha$ is an integer.

The example method of FIG. 4 may be used to calibrate all channels of the example Flash ADC of FIG. 2, for example, when there is a change in power supply voltage (e.g., during system power-on), operating temperature, or input voltage swing.

The example Flash ADC of FIG. 2 may operate at lower resolution by disabling one or more comparator block 210. For example, to disable a comparator block 210, control logic 212 can switch the first switch 301 to small signal ground. Disabling one or more comparator blocks may reduce overall power of a system incorporating the example Flash ADC of FIG. 2 due to lower input capacitance seen by a previous stage transmitting an analog input signal to the example Flash ADC.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A Flash analog-to-digital converter (ADC), comprising:
an array of comparator blocks, each comparator block having a reference level and being configured to convert an analog input to a digital output by comparing the analog input with its reference level;
a switch configured to place one of the comparator blocks in a feedback loop at a time; and
a control logic configured to calibrate the comparator blocks, comprising:
identify one of the comparator blocks;
cause the switch to place the identified comparator block in a feedback loop;
determine a target reference level for the identified comparator block;
determine a current reference level for the identified comparator black; and
if the current reference level differs from the target reference level, then adjust the reference level of the identified comparator block to the target reference level.

2. The Flash ADC of claim 1, wherein each comparator block comprises a comparator coupled to a reference capacitor.

3. The Flash ADC of claim 2, wherein determining a current reference level of the identified comparator block comprises:
decoupling the reference capacitor of the identified comparator block from the comparator of the identified comparator block;
incrementally increasing or decreasing an input voltage to the comparator and determining a first input voltage when the comparator's output logic value changes; and
assigning the first input voltage as the current reference level of the identified comparator block.

4. The Flash ADC of claim 2, wherein the reference level of the identified comparator block is adjusted to the target reference level by charging the reference capacitor.

5. The Flash ADC of claim 1, wherein identifying one of the comparator blocks comprises:
accessing a queue of decaying comparator blocks; and
selecting the first comparator block of the queue of decaying comparator blocks.

6. The Flash ADC of claim 5, wherein the queue of decaying comparator blocks is ranked by a decaying speed of each comparator block in the queue and the fastest decaying comparator block is ranked first in the queue.

7. The Flash ADC of claim 5, wherein determining a target reference level for the identified comparator block comprises:
determining a desired reference level of the second comparator block of the queue of decaying comparator blocks; and
assigning the desired reference level of the second comparator block of the queue of decaying comparator blocks as the target reference level for the identified comparator block.

8. The Flash ADC of claim 1, wherein:
the Flash ADC has a resolution of N bits; and
there are $2^{N}+1$ comparator blocks in the array of comparator blocks.

9. A method, comprising:
identifying one comparator block of an array of comparator blocks wherein each comparator block having a reference level and being configured to convert an analog input to a digital output by comparing the analog input with its reference level;
causing a switch to place the identified comparator block in a feedback loop wherein the switch being configured to place one of the comparator blocks in the feedback loop at a time;
determining a target reference level for the identified comparator block;
determining a current reference level for the identified comparator block; and
if the current reference level differs from the target reference level, then adjusting the reference level of the identified comparator block to the target reference level.

10. The method of claim 9, wherein each comparator block comprises a comparator coupled to a reference capacitor.

11. The method of claim 10, wherein the determining a current reference level for the identified comparator block comprises:
decoupling the reference capacitor of the identified comparator block from the comparator of the identified comparator block;
incrementally increasing or decreasing an input voltage to the comparator and determining a first input voltage when the comparator's output logic value changes; and
assigning the first input voltage as the current reference level of the identified comparator block.

12. The method of claim 10, wherein the reference level of the identified comparator block is adjusted to the target reference level by charging the reference capacitor.

13. The method of claim 9, wherein identifying one comparator block of the array of comparator blocks comprises:
    accessing a queue of decaying comparator blocks; and
    selecting the first comparator block of the queue of decaying comparator blocks.

14. The method of claim 13, wherein the queue of decaying comparator blocks is ranked by a decaying speed of each comparator block in the queue and the fastest decaying comparator block is ranked first in the queue.

15. The method of claim 13, wherein determining a target reference level for the identified comparator blocks comprises:
    determining a desired reference level of the second comparator block of the queue of decaying comparator blocks; and
    assigning the desired reference level of the second comparator block of the queue of decaying comparator blocks as the target reference level for the identified comparator block.

16. A system, comprising:
    means for identifying one comparator block of an array of comparator blocks wherein each comparator block having a reference level and being configured to convert an analog input to a digital output by comparing the analog input with its reference level;
    means for causing a switch to place the identified comparator block in a feedback loop wherein the switch being configured to place one of the comparator blocks in the feedback loop at a time;
    means for determining a target reference level for the identified comparator block;
    means for determining a current reference level for the identified comparator block; and
    means for adjusting the reference level of the identified comparator block to the target reference level, if the current reference level differs from the target reference level.

* * * * *